US012763280B2

(12) United States Patent
Tamaki et al.

(10) Patent No.: US 12,763,280 B2
(45) Date of Patent: Oct. 13, 2026

(54) ABERRATION CORRECTOR AND ELECTRON MICROSCOPE

(71) Applicant: HITACHI HIGH-TECH CORPORATION, Tokyo (JP)

(72) Inventors: Hirokazu Tamaki, Tokyo (JP); Yudai Kubo, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 530 days.

(21) Appl. No.: 18/031,358

(22) PCT Filed: Jan. 12, 2021

(86) PCT No.: PCT/JP2021/000704
§ 371 (c)(1),
(2) Date: Apr. 12, 2023

(87) PCT Pub. No.: WO2022/153367
PCT Pub. Date: Jul. 21, 2022

(65) Prior Publication Data
US 2024/0006148 A1 Jan. 4, 2024

(51) Int. Cl.
*H01J 37/153* (2006.01)
*H01J 37/141* (2006.01)
*H01J 37/147* (2006.01)

(52) U.S. Cl.
CPC .......... *H01J 37/153* (2013.01); *H01J 37/141* (2013.01); *H01J 37/1471* (2013.01); *H01J 2237/1534* (2013.01)

(58) Field of Classification Search
None
See application file for complete search history.

(56) References Cited

U.S. PATENT DOCUMENTS 4,303,864 A * 12/1981 Crewe .................... B82Y 15/00 313/361.1
4,414,474 A * 11/1983 Crewe .................. H01J 37/153 850/11
(Continued)

FOREIGN PATENT DOCUMENTS

DE 102014010685 A1 * 1/2015 .............. H01J 37/28
JP 2002510431 A 4/2002
(Continued)

OTHER PUBLICATIONS

English machine translation for JP-5743698-B2 (Year: 2015).*
(Continued)

*Primary Examiner* — David E Smith
*Assistant Examiner* — Alina Kaliszewski
(74) *Attorney, Agent, or Firm* — MATTINGLY & MALUR, PC

(57) ABSTRACT

An aberration corrector includes: a first multipole and a second multipole configured to form a hexapole field; and a transfer optics including a plurality of round lenses. The transfer optics is disposed between the first multipole and the second multipole, and acts on a charged particle beam such that an absolute value of a slope of the charged particle beam passing through the first multipole is different from an absolute value of a slope of the charged particle beam passing through the second multipole.

18 Claims, 11 Drawing Sheets

(56) References Cited

U.S. PATENT DOCUMENTS

| | | | | | |
|---|---|---|---|---|---|
| 4,962,313 | A * | 10/1990 | Rose | H01J 37/153 | 250/311 |
| 5,084,622 | A * | 1/1992 | Rose | H01J 37/153 | 250/396 ML |
| 6,184,975 | B1 * | 2/2001 | Henstra | H01J 37/153 | 356/123 |
| 6,191,423 | B1 * | 2/2001 | Krijn | H01J 37/153 | 250/396 ML |
| 6,555,818 | B1 * | 4/2003 | Hosokawa | H01J 37/26 | 250/311 |
| 6,605,810 | B1 * | 8/2003 | Haider | H01J 37/153 | 850/11 |
| 6,770,887 | B2 * | 8/2004 | Krivanek | H01J 37/153 | 250/311 |
| 6,924,488 | B2 * | 8/2005 | Matsuya | H01J 37/153 | 250/311 |
| 2003/0029999 | A1 * | 2/2003 | Hosokawa | G01N 23/04 | 250/310 |
| 2006/0151713 | A1 * | 7/2006 | Adamec | H01J 37/28 | 250/396 ML |
| 2008/0128635 | A1 | 6/2008 | Sawada | | |
| 2008/0265172 | A1 * | 10/2008 | Uhlemann | H01J 37/153 | 250/396 ML |
| 2008/0283749 | A1 * | 11/2008 | Muller | H01J 37/153 | 250/311 |
| 2009/0230317 | A1 * | 9/2009 | Hirayama | H01J 3/12 | 250/396 R |
| 2010/0084567 | A1 * | 4/2010 | Sawada | H01J 37/145 | 250/396 ML |
| 2011/0114852 | A1 | 5/2011 | Henstra | | |
| 2012/0119107 | A1 * | 5/2012 | Sawada | H01J 37/1471 | 250/396 ML |
| 2013/0112873 | A1 * | 5/2013 | Hirayama | H01J 37/28 | 250/311 |
| 2017/0117115 | A1 * | 4/2017 | Hirayama | H01J 37/14 | |
| 2019/0228945 | A1 * | 7/2019 | Sawada | H01J 37/153 | |
| 2019/0304739 | A1 * | 10/2019 | Morishita | H01J 37/10 | |
| 2021/0050179 | A1 * | 2/2021 | Uhlemann | H01J 37/153 | |
| 2021/0159044 | A1 * | 5/2021 | Henstra | H01J 37/153 | |
| 2021/0217578 | A1 | 7/2021 | Kasevich et al. | | |

FOREIGN PATENT DOCUMENTS

| | | | | |
|---|---|---|---|---|
| JP | 2008124001 | A | 5/2008 | |
| JP | 2009054565 | A * | 3/2009 | H01J 37/153 |
| JP | 2012109076 | A | 6/2012 | |
| JP | 2012234755 | A | 11/2012 | |
| JP | 5743698 | B2 * | 7/2015 | |
| JP | 2018136513 | A * | 8/2018 | |
| JP | 2019129073 | A | 8/2019 | |
| JP | 2019179650 | A | 10/2019 | |
| WO | 99/38188 | A1 | 7/1999 | |
| WO | 2019231908 | A1 | 12/2019 | |

OTHER PUBLICATIONS

English machine translation for JP-2009054565-A (Year: 2009).*

English machine translation for DE-102014010685-A1 (Year: 2015).*

English machine translation for JP-2018136513-A (Year: 2018).*

International Search Report of PCT/JP2021/000704 dated Jan. 12, 2021.

German Office Action received in corresponding German Application No. 11 2021 004 508.3 dated Jul. 20, 2026.

Muller, H. et al., “Advancing the Hexapole Cs-Corrector for the Scanning Transmission Electron Microscope”, Microscopy and Microanalysis, 2006, pp. 442-455.

* cited by examiner

[FIG. 1]
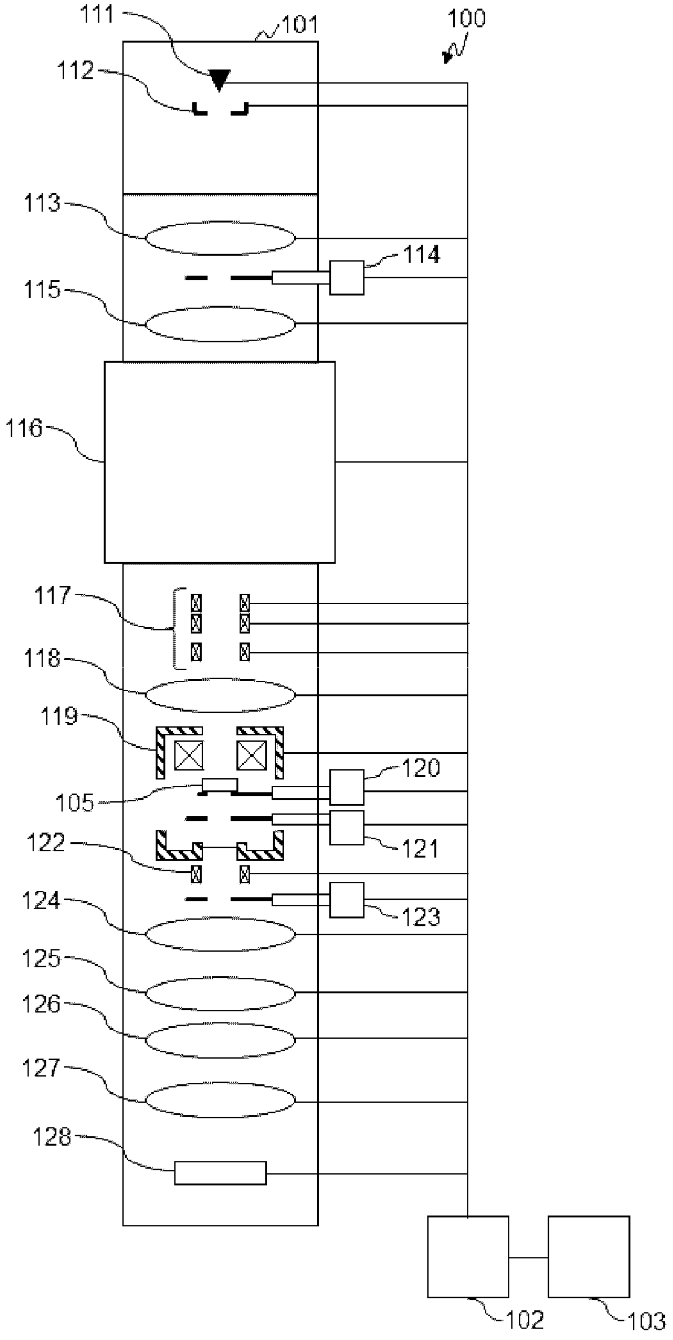

[FIG. 2A]
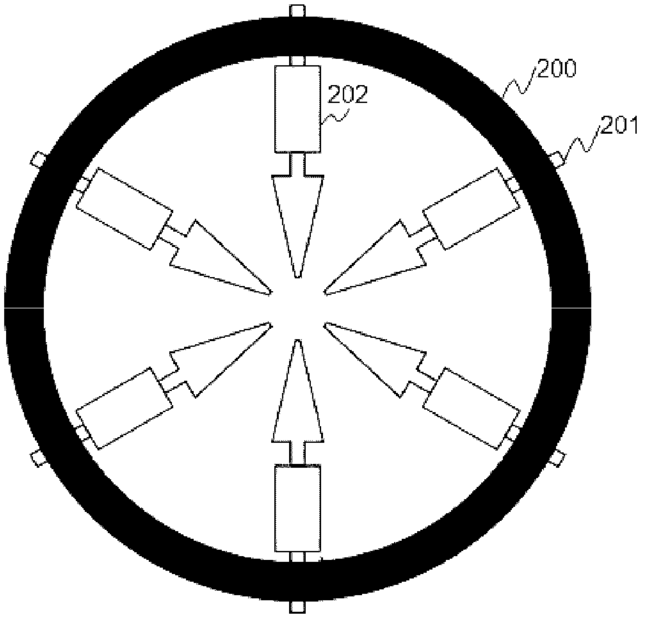
[FIG. 2B]
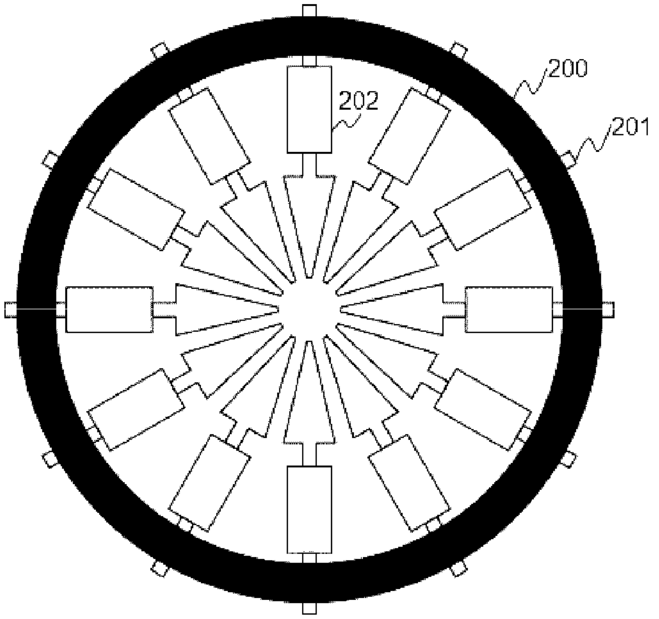

[FIG. 7A]
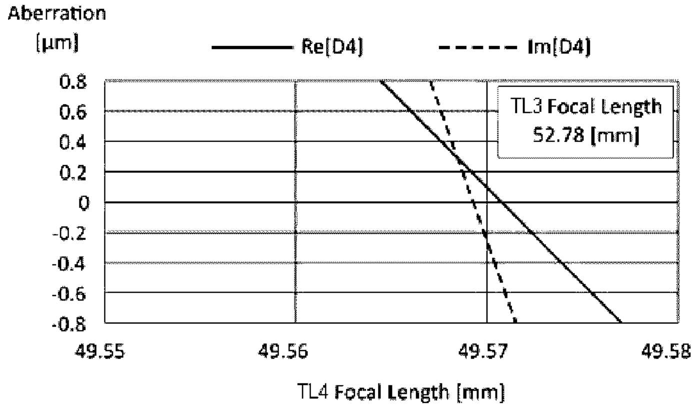
[FIG. 7B]
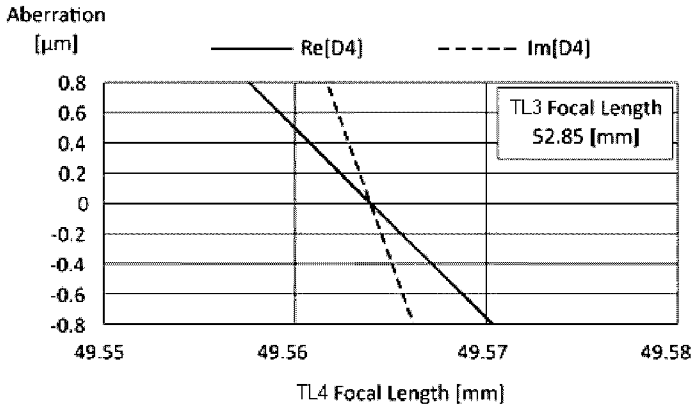
[FIG. 7C]
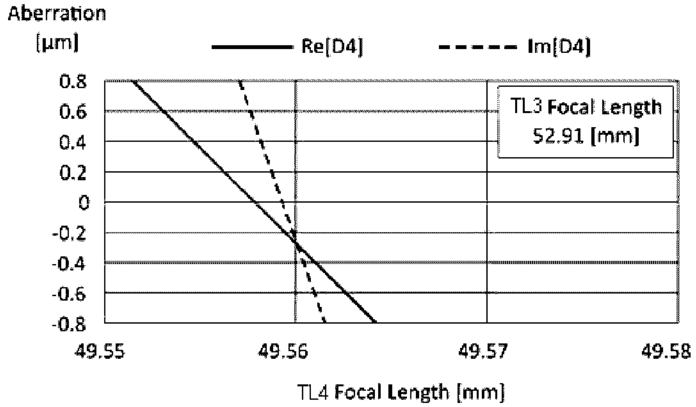

ABERRATION CORRECTOR AND ELECTRON MICROSCOPE

TECHNICAL FIELD

The present invention relates to an aberration corrector.

BACKGROUND ART

Electron microscopes such as a transmission electron microscope (hereinafter, referred to as TEM), a scanning transmission electron microscope (hereinafter, referred to as STEM), and a scanning electron microscope (hereinafter, referred to as SEM) include an aberration corrector in order to improve resolution. The aberration corrector includes multipoles provided in multiple stages, and removes aberration included in a charged particle beam passing through the aberration corrector as a multipole lens that combines a plurality of multipole fields by generating at least one of an electric field and a magnetic field (see PTL 1, for example).

PTL 1 describes that "between a first hexapole and a second hexapole, two circular lenses having the same focal length are spaced from each other by a distance of twice their focal length, and spaced from a plane passing through a center of the hexapole adjacent to each circular lens by a distance corresponding to the focal length of the circular lens".

CITATION LIST

Patent Literature

PTL 1: JP2002-510431A

SUMMARY OF INVENTION

Technical Problem

In an aberration corrector using a multipole, other aberrations such as a three-lobe aberration are generated by a three-fold symmetric field generated by the multipole. In order to improve the resolution of the electron microscope, it is necessary to correct the three-lobe aberration.

The invention provides an aberration corrector capable of correcting three-lobe aberration.

Solution to Problem

A representative example of the invention disclosed in the present application is as follows. That is, an aberration corrector includes: a first multipole and a second multipole configured to form a hexapole field; and a transfer optics including a plurality of round lenses. The transfer optics is disposed between the first multipole and the second multipole, and acts on a charged particle beam such that an absolute value of a slope of the charged particle beam passing through the first multipole is different from an absolute value of a slope of the charged particle beam passing through the second multipole.

Advantageous Effects of Invention

According to one aspect of the invention, it is possible to provide an aberration corrector capable of correcting the three-lobe aberration. Problems, configurations, and effects other than those described above will be clarified with the following description of embodiments.

BRIEF DESCRIPTION OF DRAWINGS

FIG. 1 is a diagram illustrating an example of a configuration of a transmission electron microscope according to embodiment 1.

FIG. 2A is a diagram illustrating an example of a structure of a multipole according to embodiment 1.

FIG. 2B is a diagram illustrating an example of the structure of the multipole according to embodiment 1.

FIG. 7A is a graph illustrating a relation between the focal length of the round lens that constitutes the transfer optics and the fourth order three-lobe aberration.

FIG. 7B is a graph illustrating a relation between the focal length of the round lens that constitutes the transfer optics and the fourth order three-lobe aberration.

FIG. 7C is a graph illustrating a relation between the focal length of the round lens that constitutes the transfer optics and the fourth order three-lobe aberration.

FIG. 10 is a diagram illustrating an example of a configuration of a Rose-Haider type aberration corrector.

DESCRIPTION OF EMBODIMENTS

Figure 3A:
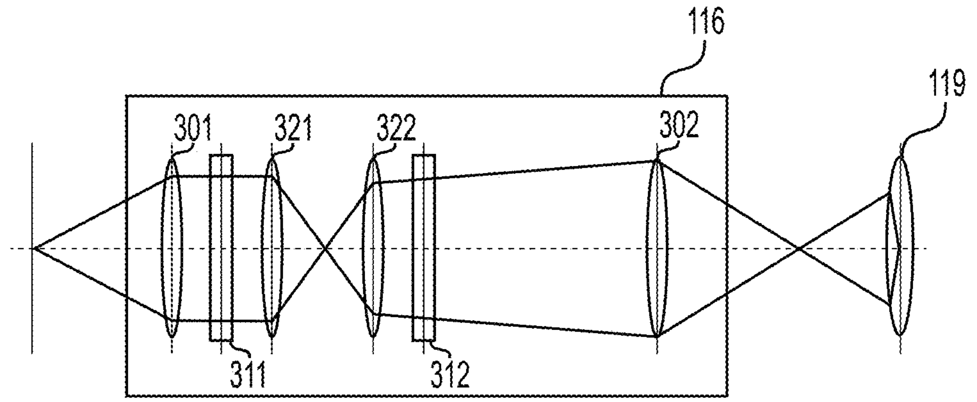
FIG. 3A is a diagram illustrating an example of a configuration of an aberration corrector according to embodiment 1.

Embodiments of the invention will be described below with reference to the drawings. However, the invention should not be construed as being limited to the description of the embodiments described below. A person skilled in the art will easily understand that specific configurations can be changed without departing from a spirit or a scope of the invention.

In configurations of the invention described below, the same or similar configurations or functions are denoted by the same reference numerals, and a repeated description thereof is omitted.

In the present specification, expressions such as “first”, “second”, and “third” are used to identify components, and do not necessarily limit the number or order.

The positions, sizes, shapes, ranges, and the like of the respective components illustrated in the drawings may not represent actual positions, sizes, shapes, ranges, and the like in order to facilitate understanding of the invention. Therefore, the invention is not limited to the positions, the sizes, the shapes, and the ranges disclosed in the drawings.

Embodiment 1

FIG. 1 is a diagram illustrating an example of a configuration of a transmission electron microscopy (TEM) according to embodiment 1.

A TEM 100 includes an electron optics lens barrel 101 and a control unit 102.

The electron optics lens barrel 101 includes an electron source 111, an electrode 112, a first condenser lens 113, an irradiation system aperture 114, a second condenser lens 115, an aberration corrector 116, a deflector 117, a third condenser lens 118, an objective lens 119, a specimen stage 120 which supports a specimen 105, an objective aperture 121, a deflector 122, a selected area aperture 123, a first imaging lens 124, a second imaging lens 125, a third imaging lens 126, a fourth imaging lens 127, and an imaging camera 128. Further, the control unit 102 and a computer 103 are connected to the electron optics lens barrel 101.

The control unit 102 controls the electron optics lens barrel 101 using a plurality of control circuits. The control unit 102 includes an electron gun control circuit, an irradiation lens control circuit, a condenser lens aperture control circuit, an aberration corrector control circuit, an axis deviation correction deflector control circuit, a deflector control circuit, an objective lens control circuit, a specimen stage control circuit, a camera control circuit, and the like.

The control unit 102 acquires a value of a target device via the control circuit and inputs the value to the target device via the control circuit to create an electron optical condition. The control unit 102 is an example of a control mechanism that achieves control of the electron optics lens barrel 101.

The control unit 102 is a computer including a processor, a main storage device, an auxiliary storage device, an input device, an output device, and a network interface.

The aberration corrector 116 according to embodiment 1 includes a round lens and a plurality of multipoles.

As the multipole, a dodecapole, a hexapole, and the like that form a magnetic field (hexapole field) having three-fold symmetry are used. FIG. 2A illustrates an example of a structure of the hexapole, and FIG. 2B illustrates an example of a structure of the dodecapole.

The dodecapole includes a configuration in which twelve magnetic poles 201 to which coils 202 are attached are disposed in a ring-shaped magnetic path 200. The hexapole includes a configuration in which six magnetic poles 201 to which the coils 202 are attached in the ring-shaped magnetic path 200. When a current flows through the coil 202, a magnetic field is generated. The magnetic field of each of the magnetic poles 201 are combined to form the hexapole field in a center area of the multipole. The control unit 102 performs control such that a charged particle beam passes through the hexapole field formed in the center area of the multipole.

Figure 3B:
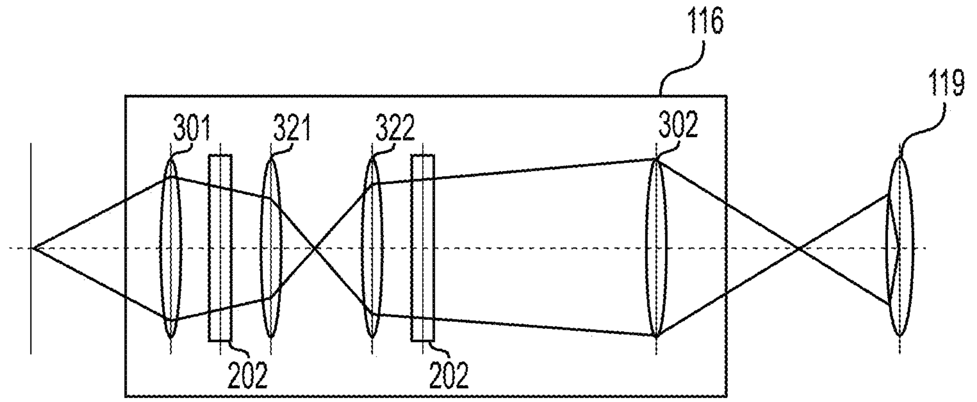
FIG. 3B is a diagram illustrating an example of the configuration of the aberration corrector according to embodiment 1.

FIG. 3A is a diagram illustrating an example of a configuration of the aberration corrector 116 according to embodiment 1, and FIG. 3B is a diagram illustrating an example of the configuration of the aberration corrector 116 according to embodiment 1.

The aberration corrector 116 includes a first adjustment lens 301, a first multipole 311, a transfer optics including two round lenses 321 and 322, a second adjustment lens 302, and a second multipole 312. As illustrated in FIG. 3A and FIG. 3B, the transfer optics is disposed between the first multipole 311 and the second multipole 312.

The configuration of the aberration corrector 116 illustrated in FIG. 3A and the configuration of the aberration corrector 116 illustrated in FIG. 3B each is an example and is not limited thereto. At least one transfer optics and at least two multipoles may be provided.

Features of the aberration corrector 116 according to embodiment 1 will be described in comparison with a Rose-Haider type aberration corrector as an example of an aberration corrector in the related art.

In the aberration corrector in the related art illustrated in FIG. 10, a focal length of a round lens 1011, a focal length of a round lens 1012, a distance L1 between a first multipole 1001 and the round lens 1011, and a distance L3 between a second multipole 1002 and the round lens 1012 are equal to each other, and the distance L2 between the round lens 1011 and the round lens 1012 is twice the distance L1. According to this configuration, the first multipole 1001 and the second multipole 1002 establish an imaging relation of magnification—1 times. A trajectory of the charged particle beam is adjusted so as to be parallel (a slope is 0) on the first multipole 1001, and further, since the first multipole 1001 and the second multipole 1002 are in the imaging relation, the slope of the trajectory formed by the charged particle beam is 0 as on the first multipole 1001 even on the second multipole 1002.

Meanwhile, in the aberration corrector 116 according to embodiment 1, in order to correct a three-lobe aberration, the transfer optics is configured to adjust a relation between an incident angle of the charged particle beam with respect to the first multipole 311 and an incident angle of the charged particle beam with respect to the second multipole 312.

Specifically, in the aberration corrector 116, at least one of a focal length and a position of the round lens that constitutes the transfer optics is adjusted such that an absolute value of a slope of the charged particle beam passing through the first multipole 311 is different from an absolute value of a slope of the charged particle beam passing through the second multipole 312. Accordingly, the three-lobe aberration of an entire optics is controlled by difference in the three-lobe aberration generated in each of the first multipole 311 and the second multipole 312.

Figure 4:
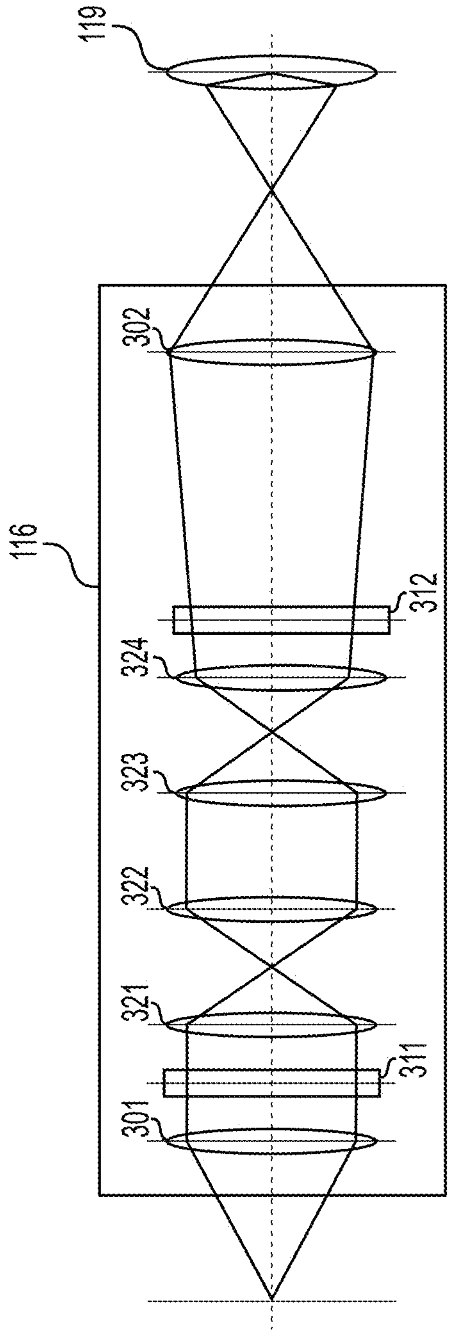
FIG. 4 is a diagram illustrating an example of the configuration of the aberration corrector according to embodiment 1.

Further, the number of the round lenses that constitutes the transfer optics may be two or more. FIG. 4 is a diagram illustrating an example of a structure of the aberration corrector 116 according to embodiment 1 according to embodiment 1.

In the aberration corrector 116 illustrated in FIG. 4, a transfer optics including four round lenses 321, 322, 323, and 324 is disposed between the first multipole 311 and the second multipole 312.

Here, a correction principle of the aberration corrector 116 according to embodiment 1 will be described.

First, occurrence of the aberration due to the hexapole field and occurrence of the aberration in an aberration correction optics using a two-stage hexapole field are considered. In the following description, an optical axis direction is set as a z axis, and a coordinate system of a plane orthogonal to the optical axis is set as an x axis and a y axis. A position of the optical axis in an xy plane is an origin of the x axis and y axis.

A magnetic potential $\Psi_6$ formed by the hexapole on the xy plane is expressed by Equation (1). Further, in the following description, a rectangular model is assumed in which a multipole field is distributed on the optical axis with a certain magnitude in a certain area.

[Math. 1]

$$\Psi_6=C((3x^2y-y^3)\cos[\eta]+(x^3-3xy^2)\sin[\eta]) \tag{1}$$

Here, η represents a phase of the hexapole field and C represents a coefficient indicating the strength of the hexapole field. At this time, magnetic fields Bx and By are expressed by Equations (2) and (3).

[Math. 2]

$$Bx=\frac{\partial\Psi_6}{\partial x}=-3C\left(2xy\cos[\eta]+\left(x^2-y^2\right)\sin[\eta]\right) \tag{2}$$

[Math. 3]

$$By=\frac{\partial\Psi_6}{\partial y}=-3C\left(\left(x^2-y^2\right)\cos[\eta]-2xy\sin[\eta]\right) \tag{3}$$

Equations of motion of electrons in x and y directions in the magnetic fields Bx and By are expressed by Equations (4) and (5). Further, a prime symbol "'" represents a differentiation with respect to the optical axis direction. u' represents the slope of the charged particle beam.

[Math. 4]

$$x''=\frac{1}{R}*\left(By*\left(1+x'^2\right)-Bx*x'*y'\right)*\left(1+\frac{x'^2}{2}+\frac{y'^2}{2}\right) \tag{4}$$

[Math. 5]

$$y''=-\frac{1}{R}*\left(Bx*\left(1+y'^2\right)-By*x'*y'\right)*\left(1+\frac{x'^2}{2}+\frac{y'^2}{2}\right) \tag{5}$$

Here, R corresponds to magnetic rigidity and is expressed by Equation (6)

[Math. 6]

$$R=\frac{\sqrt{E^2+2mc^2E}}{ec} \tag{6}$$

E represents an electron energy, m represents an electron rest mass, c represents a light velocity, and e represents an electron elementary charge.

Here, when a solution is obtained by a series solution method from the equations of motion of Equations (4) and (5), and a coordinate is expressed as a complex coordinate u=x+iy, the complex coordinate of the charged particle beam immediately after passing through the multipole is expressed by the following equation.

[Math. 7]

$$\begin{aligned}
u_{out} &= (1+T\gamma)u_{in} + \\
&\left(\frac{kT^2}{2}+\frac{1}{3}kT^3\gamma+\frac{1}{12}kT^4\gamma^2+\frac{1}{24}kT^8\gamma^2\right)u_{in}^{*2}-\frac{1}{24}kT^8\gamma^2u_{in}^2+\\
&\left(\frac{k^2T^4}{12}+\frac{k^2T^8}{24}+\frac{1}{12}k^2T^5\gamma+\frac{1}{36}k^2T^6\gamma^2+\frac{1}{252}k^2T^7\gamma^3\right)u_{in}^2u_{in}^*-\\
&\frac{1}{24}k^2T^8u_{in}u_{in}^{*2}+\left(\frac{1}{576}k^3T^8\gamma^2-\frac{1}{48}kT^8\gamma^4\right)u_{in}^{*4}+\\
&\left(\frac{1}{504}k^3T^8\gamma^2-\frac{1}{24}kT^8\gamma^4\right)u_{in}^3u_{in}^*+\\
&\left(\frac{k^3T^6}{180}+\frac{1}{126}k^3T^7\gamma+\frac{1}{2}kT^2\gamma^2+\frac{1}{504}k^3T^8\gamma^2+\frac{1}{3}kT^3\gamma^3+\frac{k^3T^9\gamma^3}{1134}+\right.\\
&\left.\frac{1}{12}kT^4\gamma^4+\frac{1}{24}kT^8\gamma^4\right)u_{in}u_{in}^{*3}+\left(\frac{k^3T^6}{120}+\frac{1}{126}k^3T^7\gamma+\frac{1}{4}kT^2\gamma^2+\right.\\
&\left.\frac{1}{576}k^3T^8\gamma^2+\frac{1}{6}kT^3\gamma^3+\frac{k^3T^9\gamma^3}{1296}+\frac{1}{24}kT^4\gamma^4+\frac{1}{48}kT^4\gamma^4\right)u_{in}^4+\\
&\left(\frac{k^4T^8}{6720}+\frac{41k^4T^9\gamma}{90720}+\frac{1}{24}k^2T^4\gamma^2+\frac{1}{48}k^2T^8\gamma^2+\frac{1}{24}k^2T^5\gamma^3+\right.\\
&\left.\frac{1}{72}k^2T^6\gamma^4+\frac{1}{504}k^2T^7\gamma^5\right)u_{in}^{*5}+\left(\frac{17k^4T^8}{20160}+\frac{209k^4T^9\gamma}{90720}+\frac{5}{24}k^2T^4\gamma^2+\right.\\
&\left.\frac{5}{48}k^2T^8\gamma^2+\frac{5}{24}k^2T^5\gamma^3+\frac{5}{72}k^2T^6\gamma^4+\frac{5}{504}k^2T^7\gamma^5\right)u_{in}^3u_{in}^{*2}+\\
&\left(\frac{17k^4T^8}{20160}-\frac{5}{48}k^2T^8\gamma^2\right)u_{in}^2u_{in}^{*3}+\left(\frac{k^4T^8}{6720}-\frac{1}{48}k^2T^8\gamma^2\right)u_{in}^5+\\
&\left(\frac{23}{720}k^3T^6\gamma^2+\frac{5}{126}k^3T^7\gamma^3+\frac{1}{8}kT^2\gamma^4+\frac{11k^3T^8\gamma^4}{1152}+\right.\\
&\left.\frac{1}{12}kT^3\gamma^5+\frac{11k^3T^9\gamma^5}{2592}+\frac{1}{48}kT^4\gamma^6+\frac{1}{96}kT^8\gamma^6\right)u_{in}^2u_{in}^{*4}+\\
&\left(\frac{11}{360}k^3T^6\gamma^2+\frac{2}{63}k^3T^7\gamma^3+\frac{1}{8}kT^2\gamma^4+\frac{29k^3T^8\gamma^4}{4032}+\right.\\
&\left.\frac{1}{12}kT^3\gamma^5+\frac{29k^3T^9\gamma^5}{9072}+\frac{1}{48}kT^4\gamma^6+\frac{1}{96}kT^8\gamma^6\right)u_{in}^5u_{in}^*
\end{aligned} \tag{7}$$

Here, T represents a thickness of the multipole, k represents a magnitude of the hexapole field, u represents a coordinate of the charged particle beam, and u* represents a complex conjugate of u. Further, $U_{in}$ represents the coordinates of the charged particle beam when the charged particle beam is incident on the multipole, and $U_{out}$ represents the coordinates of the charged particle beam immediately after passing through the multipole. γ is a parameter corresponding to the slope of the charged particle beam incident on the multipole. Since the charged particle beam is emitted from a minute area, γ is expressed by Equation (8).

[Math. 8]

$$\gamma=\frac{u'}{u} \tag{8}$$

In Equation (7), a first term corresponds to a component in which an incident charged particle beam travels straight, a second term corresponds to a second order astigmatism (A2), a third term corresponds to a second order coma aberration (B2), a fourth term corresponds to a third order spherical aberration (C3), a fifth term corresponds to a three order star aberration (S3), a sixth term corresponds to a fourth order astigmatism (A4), a seventh term corresponds to a fourth order coma aberration (B4), an eighth term and a ninth term correspond to a fourth order three-lobe aberration (D4), a tenth term corresponds to a fifth order astigmatism (A5), an eleventh term corresponds to fifth order spherical aberration (C5), a twelfth term corresponds to a fifth order star aberration (S5), a thirteenth term corresponds to a fifth order rosetta aberration (R5), and a fourteenth term and a fifteenth term correspond to a sixth order three-lobe aberration (D6). It should be noted that the above equations may further include other aberration terms by being expanded to a higher order.

In order to consider an action of the transfer optics, electron propagation in a free space is expressed by Equation (9). Here, D represents a propagation distance, $u_{in\_trans}$ represents a position before the propagation, and $u_{out\_trans}$ represents a position after the propagation. Further, $u'_{in\_trans}$ represents a slope of the charged particle beam before propagation and $u'_{out\_trans}$ represents the slope after propagation.

[Math. 9]

$$\begin{pmatrix} u_{out\_trans} \\ u'_{out\_trans} \end{pmatrix} = \begin{pmatrix} 1 & D \\ 0 & 1 \end{pmatrix} \begin{pmatrix} u_{in\_trans} \\ u'_{in\_trans} \end{pmatrix} \tag{9}$$

An action of a lens on the charged particle beam is expressed by Equation (10).

[Math. 10]

$$\begin{pmatrix} u_{out\_trans} \\ u'_{out\_trans} \end{pmatrix} = \begin{pmatrix} 1 & 0 \\ \frac{-1}{f} & 1 \end{pmatrix} \begin{pmatrix} u_{in\_trans} \\ u'_{in\_trans} \end{pmatrix} \tag{10}$$

Here, f represents a focal length of the lens.

A case in which an action of the 2-stage hexapole field is added by the transfer optics is considered based on these equations. Hereinafter, for the sake of simplicity of description, it is assumed that $L_1=L_3=L$, $L_2=2L$, and $T_1=T_2=T$ in the Rose-Haider type aberration corrector illustrated in FIG. 10. However, even when $L_1$, $L_2$, and $L_3$ are set to any values, the principle described below does not lose generality.

In the optics of the aberration corrector in the related art, the aberration generated in the first multipole 1001 is transferred to the second multipole 1002 by the round lenses 1011 and 1012. Here, an upstream side end surface of the multipole is defined as an upper surface, and a downstream side end surface is defined as a lower surface.

In the case of the coordinate on the lower surface of the first multipole 1001 being a coordinate $u_0$, a coordinate $u_{H2i}$ and a slope $u'_{H2i}$ on the upper surface of the second multipole 1002 are expressed as Equation (11) using Equations (9) and (10).

[Math. 11]

$$\begin{pmatrix} u_{H2i} \\ u'_{H2i} \end{pmatrix} = \begin{pmatrix} \dfrac{L(4f1f2 - 3(f1+f2)L + 2L^2)u'_0 + (f1f2 - (f1+3f2)L + 2L^2)u_0}{f1f2} \\ \dfrac{(f1f2 - (3f1+f2)L + 2L^2)u'_0 - (f1+f2-2L)u_0}{f1f2} \end{pmatrix} \tag{11}$$

Here, f1 represents the focal length of the round lens 1011, and f2 represents the focal length of the round lens 1012.

In Equation (11), when f1=f2=L corresponding to a 4f-system in the Rose-Haider type optics is substituted, the coordinate $u_{H2i}$ and the slope $u'_{H2i}$ are expressed by Equation (12).

[Math. 12]

$$(u_{H2i}, u'_{H2i}) = (-u_0, -u'_0) \tag{12}$$

Since the absolute values of the position and the slope are equal to each other and only a sign is reversed, it can be seen that the transfer is performed at the magnification—1. In the Rose-Haider type correction optics and a derivative type correction optics in the related art, in addition to the above conditions, the slope $u'_0$ of an electron trajectory incident on the multipole is adjusted to 0, and thus the absolute value of the slope of the electron trajectory on the first multipole 1001 is equal to the absolute value of the slope of the electron trajectory on the second multipole 1002.

Further, a slope parameter $\gamma_{Hex2}$ of the charged particle beam incident on the second multipole 1002 is obtained as in Equations (11) to (13). Further, for the sake of simplicity of description, it is assumed that $u'_0=0$, which is a general condition for the aberration correction optics.

[Math. 13]

$$\gamma_{Hex2}(f1, f2) = \frac{u'_{H2i}}{u_{H2i}} = \frac{-2(f1+f2-2L)}{-6f2L + 4L^2 + f2T - 2LT + f1(2f2 - 2L + T)} \tag{13}$$

Equation (13) represents dependence of $\gamma$ on the focal lengths of the round lenses 1011 and 1012.

Further, the coordinate $u_{H20}$ and the slope $u'_{H20}$ on the lower surface of the second multipole 1002 are expressed by Equation (14) using Equations (9) and (10) based on the same consideration as described above.

[Math. 14]

$$(u_{H20}, u'_{H20}) = \left( \frac{-6f2L + 4L^2 + f2T - 2LT + f1(2f2 - 2L + T)}{2f1f2} u_0, -\frac{f1+f2-2L}{f1f2} u_0 \right) \tag{14}$$

Here, a magnification M is defined by Equation (15).

[Math. 15]

$$M(f1, f2) = \frac{u_{H20}}{u_0} = \frac{-6f2L + 4L^2 + f2T - 2LT + f1(2f2 - 2L + T)}{2f1f2} \tag{15}$$

The magnification M represents a magnification when a passing point of the charged particle beam on the lower surface of the first multipole 1001 is transferred to the lower surface of the second multipole 1002 by the round lenses 1011 and 1012.

From Equation (7), deviation amounts $U_{out\_A2}$, $U_{out\_C3}$, $U_{out\_D4}$, and $U_{out\_D6}$ of the charged particle beam on the lower surface of the multipole caused by A2, C3, D4, and D6, which are main aberrations, are expressed by Equation (16), Equation (17), Equation (18), and Equation (19) using the magnitude k of the hexapole field, the slope parameter γ of the trajectory, and the thickness T of the multipole.

[Math. 16]

$$U_{out\_A2}(k,T,\gamma)=\left(\frac{kT^2}{2}+\frac{1}{3}kT^3\gamma+\frac{1}{12}kT^4\gamma^2+\frac{1}{24}kT^8\gamma^2\right)u_{in}^{*2} \tag{16}$$

[Math. 17]

$$U_{out\_C3}(k,T,\gamma)=\left(\frac{k^2T^4}{12}+\frac{k^2T^8}{24}+\frac{1}{12}k^2T^5\gamma+\frac{1}{36}k^2T^6\gamma^2+\frac{1}{252}k^2T^7\gamma^3\right)u_{in}^2u_{in}^* \tag{17}$$

[Math. 18]

$$U_{out\_D4}(k,T,\gamma)=\left(\frac{k^3T^6}{180}+\frac{1}{126}k^3T^7\gamma+\frac{1}{2}kT^2\gamma^2+\frac{1}{504}k^3T^8\gamma^2+\frac{1}{3}kT^3\gamma^3+\frac{k^3T^9\gamma^3}{1134}+\frac{1}{12}kT^4\gamma^4+\frac{1}{24}kT^8\gamma^4\right)u_{in}u_{in}^{*3}+\left(\frac{k^3T^6}{120}+\frac{1}{126}k^3T^7\gamma+\frac{1}{4}kT^2\gamma^2+\frac{1}{576}k^3T^8\gamma^2+\frac{1}{6}kT^3\gamma^3+\frac{k^3T^9\gamma^3}{1296}+\frac{1}{24}kT^4\gamma^4+\frac{1}{48}kT^8\gamma^4\right)u_{in}^4 \tag{18}$$

[Math. 19]

$$U_{out\_D6}(k,T,\gamma)=\left(\frac{23}{720}k^3T^6\gamma^2+\frac{5}{126}k^3T^7\gamma^3+\frac{1}{8}kT^2\gamma^4+\frac{11k^3T^8\gamma^4}{1152}+\frac{1}{12}kT^3\gamma^5+\frac{11k^3T^9\gamma^5}{2592}+\frac{1}{48}kT^4\gamma^6+\frac{1}{96}kT^8\gamma^6\right)u_{in}^2u_{in}^{*4}+\left(\frac{11}{360}k^3T^6\gamma^2+\frac{2}{63}k^3T^7\gamma^3+\frac{1}{8}kT^2\gamma^4+\frac{29k^3T^8\gamma^4}{4032}+\frac{1}{12}kT^3\gamma^5+\frac{29k^3T^9\gamma^5}{9072}+\frac{1}{48}kT^4\gamma^6+\frac{1}{96}kT^8\gamma^6\right)u_{in}^5u_{in}^* \tag{19}$$

When the slope of the charged particle beam of the first multipole 1001 is set to 0 (the trajectory parallel to the optical axis), components generated by A2, C3, and D4 on the lower surface of the first multipole 1001 are expressed by Equations (20), (21), and (22).

[Math. 20]

$$A2_{H1}=U_{out\_A2}(k1,T1,0) \tag{20}$$

[Math. 21]

$$C3_{H1}=U_{out\_C3}(k1,T1,0) \tag{21}$$

[Math. 22]

$$D4_{H1}=U_{out\_D4}(k1,T1,0) \tag{22}$$

Further, components generated by A2, C3, and D4 on the lower surface of the second multipole 1002 are expressed by Equations (23), (24), and (25) in consideration of change in the slope parameter γ by the round lenses 1011 and 1012 obtained by Equation (13).

[Math. 23]

$$A2_{H2}=U_{out\_A2}(k2,T2,\gamma_{Hex2}(f1,f2)) \tag{23}$$

[Math. 24]

$$C3_{H2}=U_{out\_C3}(k2,T2,\gamma_{Hex2}(f1,f2)) \tag{24}$$

[Math. 25]

$$D4_{H2}=U_{out\_D4}(k2,T2,\gamma_{Hex2}(f1,f2)) \tag{25}$$

The aberration generated on the lower surface of the first multipole 1001 is transferred to the lower surface of the second multipole 1002 at the magnification M(f1, f2), and is added to an aberration component generated in the second multipole 1002. Accordingly, amounts of the aberration on the lower surface of the second multipole 1002 are expressed by Equations (26), (27), and (28).

[Math. 26]

$$A2_{all}=A2_{H1}\left(\frac{1}{M(f1,f2)}\right)^3+A2_{H2} \tag{26}$$

[Math. 27]

$$C3_{all}=C3_{H1}\left(\frac{1}{M(f1,f2)}\right)^4+C3_{H2} \tag{27}$$

[Math. 28]

$$D4_{all}=D4_{H1}\left(\frac{1}{M(f1,f2)}\right)^5+D4_{H2} \tag{28}$$

Further, here, the aberration component generated in the second multipole 1002 with respect to the aberration component generated in the first multipole 1001, that is, a so-called combination aberration component is not considered.

The conditions for simultaneously correcting the aberrations A2, C3, and D4 are considered based on the above equations. First, for A2, $A2_{all}$ is 0 by setting a ratio of k1 and k2 in Equation (26) to an appropriate value. The above ratio is determined by the thickness T of the multipole and the focal lengths f1 and f2 of the round lenses 1011 and 1012, and can be expressed by Equation (29). $F_1$, $F_2$, $F_3$, $F_4$, and $F_5$ are given by Equations (30), (31), (32), (33), and (34).

[Math. 29]

$$k2(k1,f1,f2)=\frac{24f1^3f2^3k1}{(F_1+F_2+F_3+F_4)F_5} \tag{29}$$

[Math. 30]

$$F_1=\left(12\left(f1f2-(f1+3f2)L+2L^2\right)^2\right. \tag{30}$$

[Math. 31]

$$F_2=4(f1+f2-2L)\left(f1f2-(f1+3f2)L+2L^2\right)T \tag{31}$$

[Math. 32]

$$F_3=(f1+f2-2L)^2T^2 \tag{32}$$

[Math. 33]

$$F_4=(f1+f2-2L)^2T^6 \tag{33}$$

[Math. 34]

$$F_5=\left(-6f2L+4L^2+f2T-2LT+f1(2f2-2L+T)\right) \tag{34}$$

As long as a relation of Equation (29) can be satisfied, A2 can be set to 0 for any condition of k1, T, f1, and f2. A rotation relation (phase) between the first multipole 1001 and the second multipole 1002 is adjusted to an appropriate relation according to rotation actions of the trajectories generated in the round lenses 1011 and 1012 such that A2 generated in the first multipole 1001 and A2 generated in the second multipole 1002 are in a direction of cancelling each other out.

Next, adjustment of f1 and f2 when k2 is a value determined by Equation (29) is considered. For example, when T1=T2=T, $C3_{all}$ and $D4_{all}$ are expressed by Equations (35) and (36).

[Math. 35]

$$C3_{all}(M,\gamma,k_1)=\frac{12k_1^2T^4}{M^6(12+8\gamma T+2\gamma^2T^2+\gamma^2T^6)^2}+\frac{12k_1^2\gamma T^5}{M^6(12+8\gamma T+2\gamma^2T^2+\gamma^2T^6)^2}+\frac{4k_1^2\gamma^2T^6}{M^6(12+8\gamma T+2\gamma^2T^2+\gamma^2T^6)^2}+\frac{4k_1^2\gamma^3T^7}{7M^6(12+8\gamma T+2\gamma^2T^2+\gamma^2T^6)^2}+\frac{6k_1^2T^8}{M^6(12+8\gamma T+2\gamma^2T^2+\gamma^2T^6)^2}+\frac{\frac{k_1^2T^4}{12}+\frac{k_1^2T^8}{24}}{M^4} \quad (35)$$

[Math. 36]

$$D4_{all}(M,\gamma,k_1)=\frac{k_1^3T^6}{180M^5}-\frac{48k_1^3T^6}{5M^9(12+8\gamma T+2\gamma^2T^2+\gamma^2T^6)^3}-\frac{96k_1^3\gamma T^7}{7M^9(12+8\gamma T+2\gamma^2T^2+\gamma^2T^6)^3}-\frac{24k_1^3\gamma^2T^8}{7M^9(12+8\gamma T+2\gamma^2T^2+\gamma^2T^6)^3}-\frac{32k_1^3\gamma^3T^9}{21M^9(12+8\gamma T+2\gamma^2T^2+\gamma^2T^6)^3}-\frac{6k_1\gamma^2T^2}{M^3(12+8\gamma T+2\gamma^2T^2+\gamma^2T^6)}-\frac{4k_1\gamma^3T^3}{M^3(12+8\gamma T+2\gamma^2T^2+\gamma^2T^6)}-\frac{k_1\gamma^4T^4}{M^3(12+8\gamma T+2\gamma^2T^2+\gamma^2T^6)}-\frac{k_1\gamma^4T^8}{2M^3(12+8\gamma T+2\gamma^2T^2+\gamma^2T^6)} \quad (36)$$

Here, M is a parameter corresponding to the magnification from the lower surface of the first multipole 1001 to the lower surface of the second multipole 1002, and γ is a parameter corresponding to the slope of the charged particle beam incident on the second multipole 1002, and M and γ are expressed by Equations (37) and (38).

[Math. 37]

$$M(f1,f2)=1-\frac{L_2}{f_1}-\frac{(f_1+f_2-L_2)(T+2L_3)}{2f_1f_2} \quad (37)$$

[Math. 38]

$$\gamma(f1,f2)=-\frac{2(f_1+f_2-L_2)}{-L_2(T-2L_3)+f_1(T+2f_2-2L_3)+f_2(T-2L_2-2L_3)} \quad (38)$$

Figure 5A:
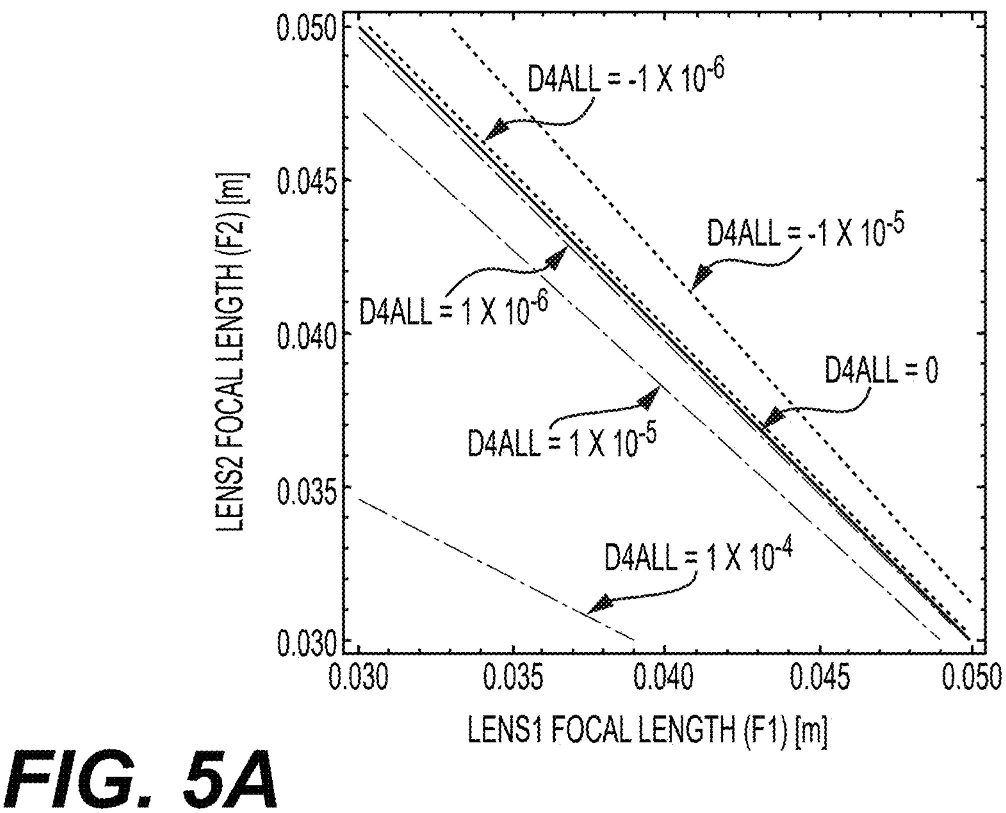
FIG. 5A is a graph illustrating a relation of a focal length of a round lens that constitutes a transfer optics to a fourth order three-lobe aberration.
Figure 5B:
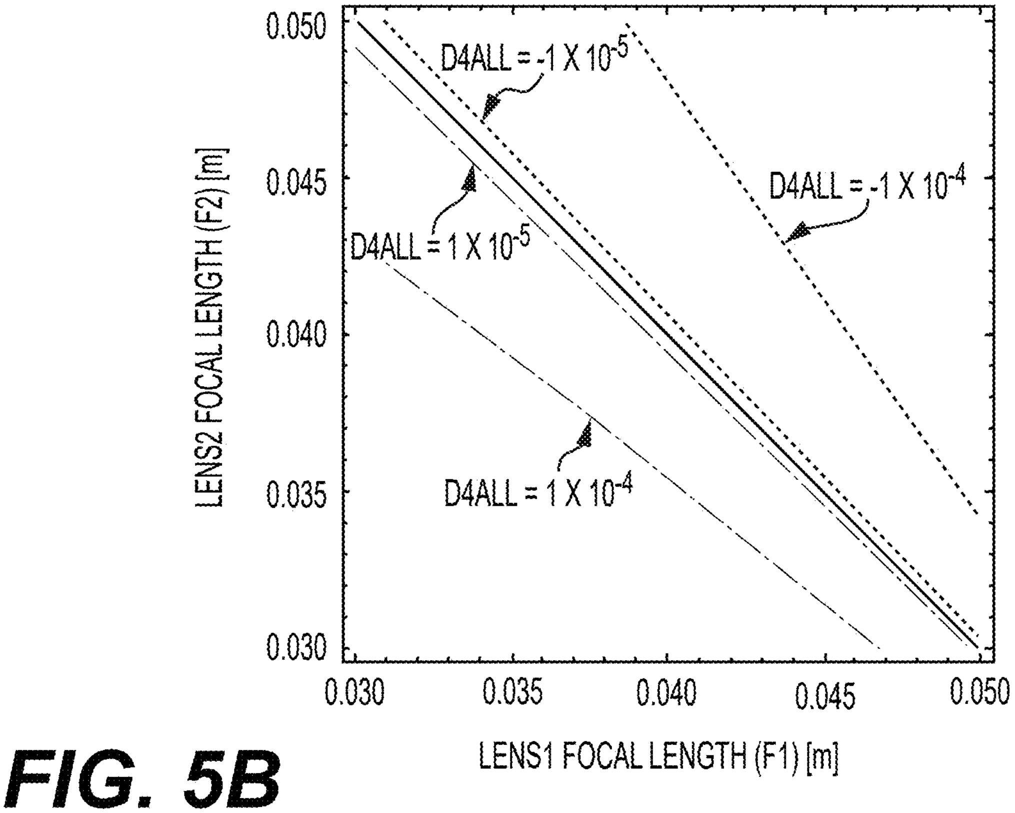
FIG. 5B is a graph illustrating a relation of the focal length of the round lens that constitutes the transfer optics to the fourth order three-lobe aberration.

FIG. 5A and FIG. 5B illustrate changes in $D4_{all}$ when f1 and f2 are changed based on Equation (36). When the magnitude k1 of the hexapole field of the first multipole 1001 is fixed to a constant value, conditions are plotted under which $D4_{all}$ is a predetermined value ($\pm1\times1^{-4}$ [m], $\pm1\times1^{-5}$ [m], $\pm1\times1^{-6}$ [m], 0). FIG. 5A illustrates a result of evaluation with $k1=4\times10^6$ [T/m$^2$], and FIG. 5B illustrates a result of evaluation with $k1=6\times10^6$ [T/m$^2$].

The values and ranges of other parameters used for the evaluation are as follows.

L: $40\times10^{-3}$[m]

T: $30\times10^{-3}$[m]

f1: $30\times10^{-3}$ to $50\times10^{-3}$[m]

f2: $30\times10^{-3}$ to $50\times10^{-3}$[m]

f: $1.38\times10^{-3}$[m]

Here, f is a parameter corresponding to an apparent focal length representing a relation between a displacement amount of the charged particle beam in the correction optics and a displacement of a convergence angle on a convergence plane of the charged particle beam.

In FIG. 5A and FIG. 5B, $D4_{all}$ is 0 when f1=f2=0.040[m]. This is because the 4f-system in the so-called Rose-Haider type optics is established under the above conditions, and D4 generated in the first multipole 1001 and D4 generated in the second multipole 1002 are cancelled out. Further, it can be confirmed that the value of $D4_{all}$ is a value close to 0 even under other conditions where f1+f2 is 0.08. Meanwhile, it can be seen that $D4_{all}$ is a negative value in an area where the value of f1+f2 is larger than 0.08 where the 4f-system is established (upper right in the figure), and $D4_{all}$ is a positive value in an area where the value of f1+f2 is smaller than 0.08 (lower left in the figure).

As described above, since D4 generated in the first multipole 1001 and D4 generated in the second multipole 1002 are cancelled out under the condition where the 4f-system is established, D4 of the entire optics is basically a small value. However, in fact, it is known that the D4 component and the like, which are generated due to continuous attenuation (fringing effect) of the magnitude of the pole field at the ends of the multipole, and influence of the aberration of the round lens that constitutes the transfer optics, remain without being cancelled out. Although the configurations illustrated in the drawings and the equations do not include the influence of such effects, it is necessary to correct such surplus components in an actual optics. In the invention, as illustrated in FIG. 5A and FIG. 5B, by adjusting the values of f1 and f2, the total amount of D4 possessed by the entire optics is controlled and corrected to 0. Further, depending on a combination of f1 and f2, there may be a case in which the center plane of the first multipole 1001 with respect to the thickness in the optical axis direction and the center plane of the second multipole 1002 with respect to the thickness in the optical axis direction do not satisfy the imaging relation. This is a basic effect of the configuration of the invention.

Figure 5C:
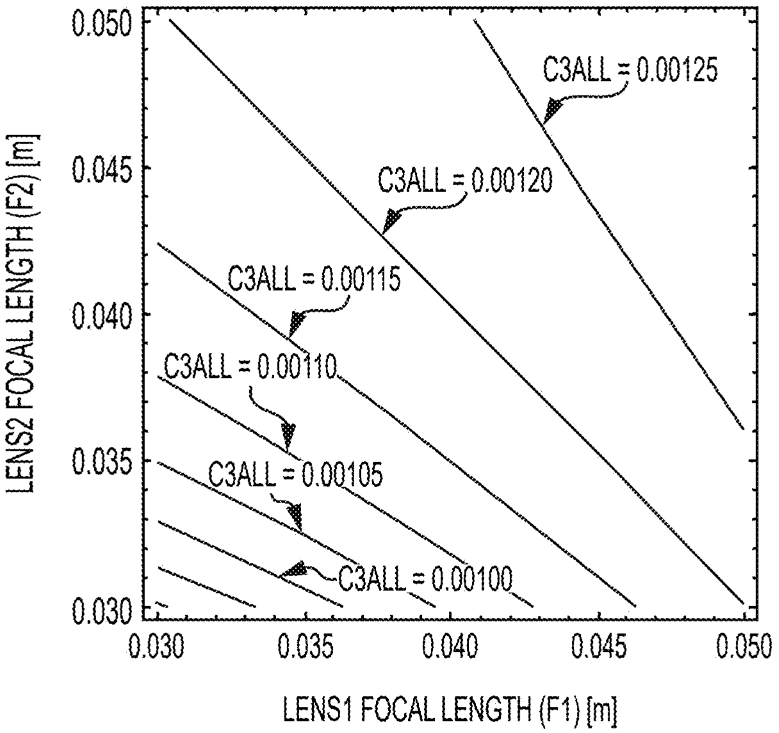
FIG. 5C is a graph illustrating a relation of the focal length of the round lens that constitutes the transfer optics to a third order spherical aberration.
Figure 5D:
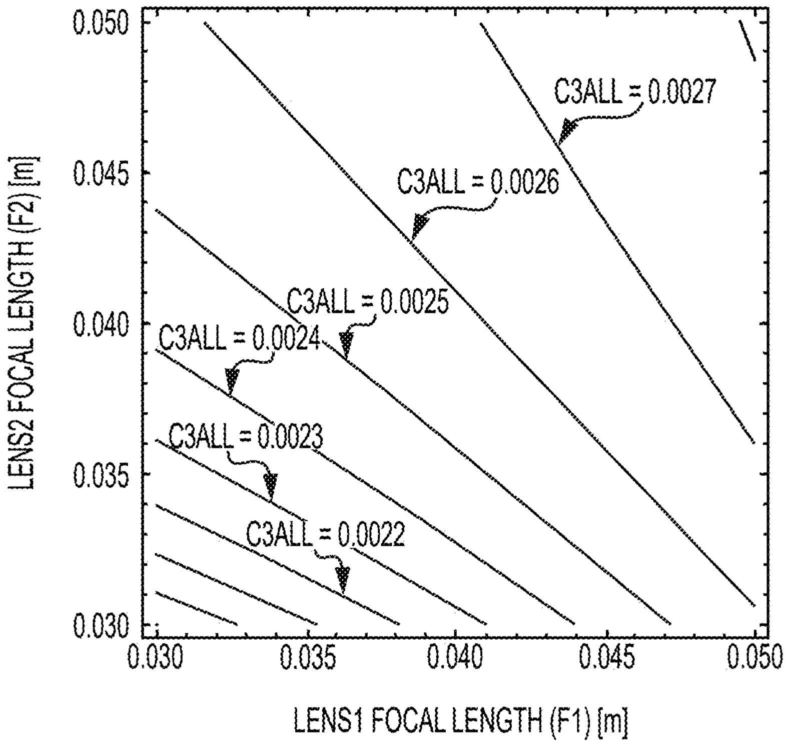
FIG. 5D is a graph illustrating a relation of the focal length of the round lens that constitutes the transfer optics to the third order spherical aberration.

FIG. 5C is a graph in which $C3_{all}$ represented by Equation (27) is plotted under the same condition as in FIG. 5A, and FIG. 5D is a graph in which $C3_{all}$ represented by Equation (27) is plotted under the same condition as in FIG. 5B. The graph illustrates that $C3_{all}$ also changes simultaneously with $D4_{all}$ by adjusting f1 and f2.

A notable point about these results is that when the condition under which $D4_{all}$ in FIG. 5A and FIG. 5B are the same value (for example, $1\times10^{-4}$ [m]) are compared with that in FIG. 5C and FIG. 5D, the obtained value of $C3_{all}$ is greatly different between both. From this, it can be seen that D4 can be freely changed within a certain range by appropriately adjusting f1 and f2 and k1 (corresponding k2), and C3 can be simultaneously changed by adjusting k1. This indicates that C3 and D4 can be simultaneously corrected.

Figure 6:
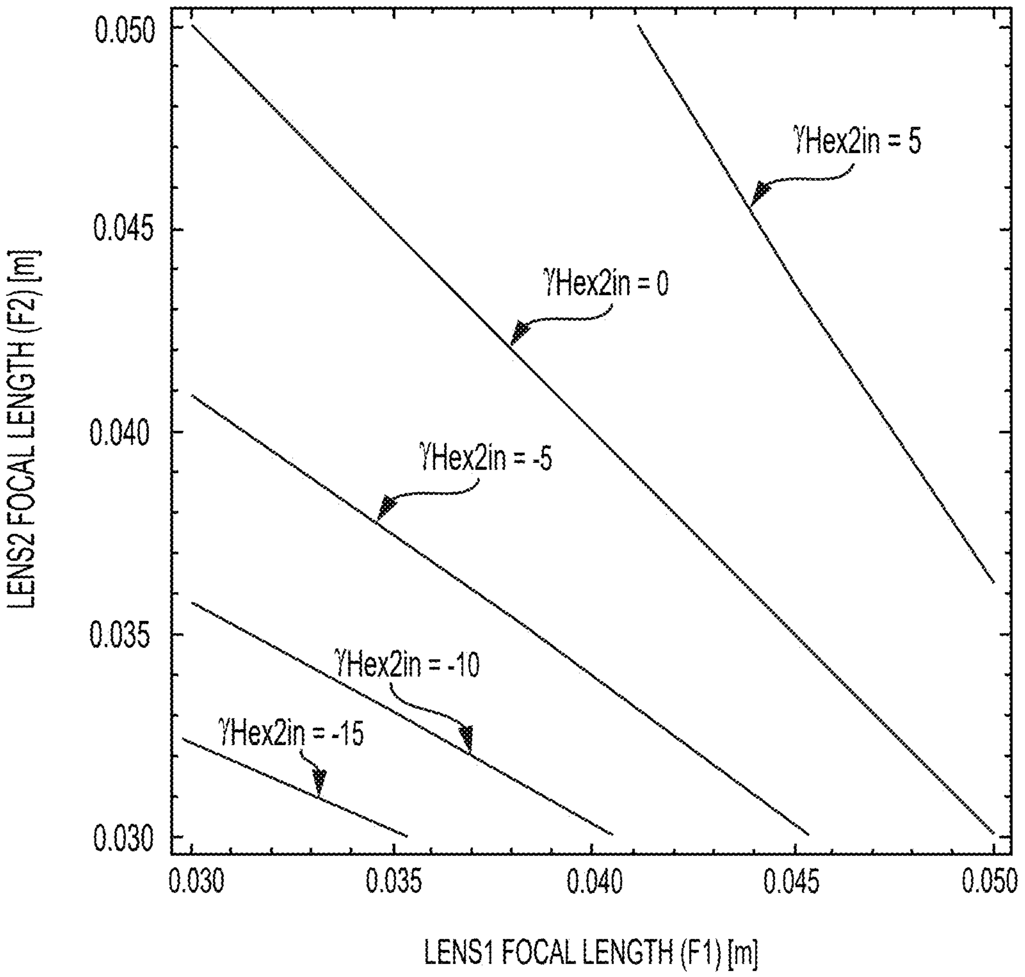
FIG. 6 is a graph illustrating a relation between the focal length of the round lens that constitutes the transfer optics and a slope parameter $\gamma$.

FIG. 6 illustrates results of determining the values of γ under the conditions of f1 and f2 illustrated in FIG. 5 based on Equation (38). In the drawing, plotting is performed for each condition in which γ is −15, −10, −5, 0, and 5. The value of γ is about −20 to 10, and indicates a guideline for the value of γ necessary for correcting C3 of several millimeters and D4 of several tens of micrometers.

Further, it should be noted that this value is changed from the above guideline depending on a configuration of the correction optics, an amount of aberration of the objective lens, and an energy of an electron beam used for correction.

As described above, D4 can be corrected by creating a relative difference in γ between the first multipole 1001 and the second multipole 1002.

In the aberration corrector 116 in FIG. 4, a real part component and an imaginary part component of the fourth order three-lobe aberration when a focal length of a round lens 324 is changed with respect to a round lens 323 having a certain focal length are changed as illustrated in FIG. 7A, FIG. 7B, and FIG. 7C. Further, results illustrated in FIG. 7A, FIG. 7B, and FIG. 7C are obtained by optical calculation including the fringing effect, which is the influence of the multipole field spreading with the attenuation on the optical axis, and the influence of the combination aberration caused by the combination of aberrations.

It is assumed that points of the graph are adjusted such that A2 and C3 is 0 in the entire optics. Further, TL3 indicates the round lens 323, and TL4 indicates the round lens 324.

The real part and the imaginary part of D4 monotonically change with respect to the focal length of the round lens 324, and the respective slopes are different. As illustrated in FIG. 7A, FIG. 7B, and FIG. 7C, the real part and the imaginary part of D4 have the same value under a certain condition. Further, by adjusting the focal length of the round lens 323, the real part and the imaginary part of D4 can be simultaneously set to 0.

Embodiment 2

In embodiment 2, the aberration corrector 116 capable of correcting high order aberrations by applying the principle of the correction according to embodiment 1 will be described.

Figure 8:
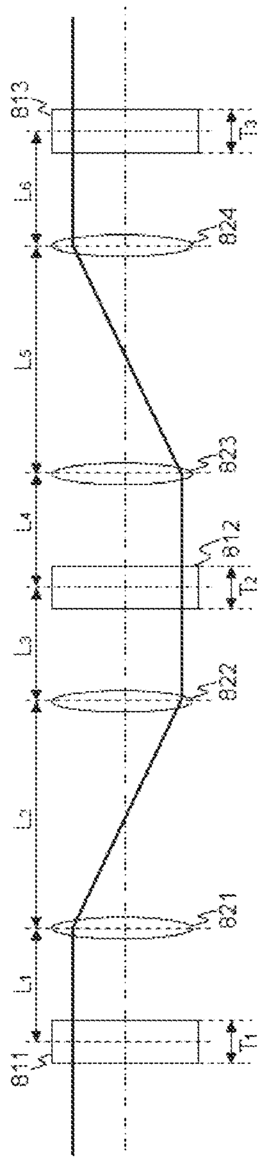
FIG. 8 is a diagram illustrating an example of a configuration of an aberration corrector according to embodiment 2.

FIG. 8 is a diagram illustrating an example of the structure of the aberration corrector 116 according to embodiment 2.

The aberration corrector 116 according to embodiment 2 includes a first transfer optics including round lenses 821 and 822, and a second transfer optics including round lenses 823 and 824, in addition to a first multipole 811, a second multipole 812, and a third multipole 813. The first transfer optics is disposed between the first multipole 811 and the second multipole 812, and the second transfer optics is disposed between the second multipole 812 and the third multipole 813.

The first multipole 811, the second multipole 812, and the third multipole 813 form a hexapole field. An optical relation between the first multipole 811 and the second multipole 812 and an optical relation between the second multipole 812 and the third multipole 813 are adjusted to be the same as an optical relation between the first multipole 311 and the second multipole 312 according to embodiment 1.

In the aberration corrector 116 according to embodiment 2, the imaging magnification M and the slope parameter γ between the first multipole 811 and the second multipole 812 and the imaging magnification M and the slope parameter γ between the second multipole 812 and the third multipole 813 can be independently controlled. Specifically, control of the imaging magnification M and the slope parameter γ between the first multipole 811 and the second multipole 812 is achieved by adjusting any of focal lengths and positions of the round lenses 821 and 822, and control of the imaging magnification M and the slope parameter γ between the second multipole 812 and the third multipole 813 is achieved by adjusting any of focal lengths and positions of the round lenses 823 and 824.

When the coupling magnification between the first multipole 811 and the second multipole 812 is defined as $M_{Hex12}$, the slope parameter of the charged particle beam incident on the second multipole 812 is defined as $\gamma_{Hex2}$, the coupling magnification between the second multipole 812 and the third multipole 813 is defined as $M_{Hex23}$, and the slope parameter of the charged particle beam incident on the third multipole 813 is defined as $\gamma_{Hex3}$, amounts of the aberrations on the lower surface of the third multipole 813 are expressed by Equations (39), (40), (41), and (42).

[Math. 39]

$$A2_{all} = A2_{H1}\left(\frac{1}{M_{Hex12}(f1, f2)M_{Hex23}(f3, f4)}\right)^3 + A2_{H2}\left(\frac{1}{M_{Hex23}(f3, f4)}\right)^3 + A2_{H3} \tag{39}$$

[Math. 40]

$$C3_{all} = C3_{H1}\left(\frac{1}{M_{Hex12}(f1, f2)M_{Hex23}(f3, f4)}\right)^4 + C3_{H2}\left(\frac{1}{M_{Hex23}(f3, f4)}\right)^4 + C3_{H3} \tag{40}$$

[Math. 41]

$$D4_{all} = D4_{H1}\left(\frac{1}{M_{Hex12}(f1, f2)M_{Hex23}(f3, f4)}\right)^5 + D4_{H2}\left(\frac{1}{M_{Hex23}(f3, f4)}\right)^5 + D4_{H3} \tag{41}$$

[Math. 42]

$$D6_{all} = D6_{H1}\left(\frac{1}{M_{Hex12}(f1, f2)M_{Hex23}(f3, f4)}\right)^7 + D6_{H2}\left(\frac{1}{M_{Hex23}(f3, f4)}\right)^7 + D6_{H3} \tag{42}$$

Here, $A2_{H3}$, $C3_{H3}$, $D4_{H3}$, $D6_{H1}$, $D6_{H2}$, and $D6_{H3}$ are given by Equations (43), (44), (45), (46), (47), and (48), respectively.

[Math. 43]

$$A2_{H3}=U_{out\_A3}(k3,T3,\gamma_{Hex3}(f1,f2,f3,f4)) \tag{43}$$

[Math. 44]

$$C3_{H3}=U_{out\_C3}(k3,T3,\gamma_{Hex3}(f1,f2,f3,f4)) \tag{44}$$

[Math. 45]

$$D4_{H3}=U_{out\_D4}(k3,T3,\gamma_{Hex3}(f1,f2,f3,f4)) \tag{45}$$

[Math. 46]

$$D6_{H1}=U_{out\_D6}(k1,T1,0) \tag{46}$$

[Math. 47]

$$D6_{H2}=U_{out\_D6}(k2,T2,\gamma_{Hex2}(f1,f2)) \tag{47}$$

[Math. 48]

$$D6_{H3}=U_{out\_D6}(k3,T3,\gamma_{Hex3}(f1,f2,f3,f4)) \quad (48)$$

K3 represents a magnitude of the hexapole field of the third multipole 813, and T3 represents a thickness of the third multipole 813.

In Equation (39), $A2_{all}$ can be set to 0 for any combination of f1, f2, f3, and f4 by appropriately setting ratios of k2 and k3 to k1. Further, control of $D4_{all}$ by adjusting f1 and f2 illustrated in FIG. 5A and FIG. 5B can be performed in the same manner by adjusting f3 and f4 in a state of f1=f2=L1=L2/2=L3=L4=L5/2=L6, and $D4_{all}$ can be adjusted in both positive and negative areas including 0.

At this time, when the values of f1 and f2 are changed, the values of $D4_{all}$ and $D6_{all}$ for f3 and f4 are changed to different values. Therefore, by appropriately adjusting f1, f2, f3, and f4 respectively, $D4_{all}$ and $D6_{all}$ can be independently adjusted in both the positive and negative areas including 0.

In addition, by appropriately setting the value of k1 and the corresponding values of k2 and k3, the aberration corrector 116 according to embodiment 2 can simultaneously correct A2, C3, D4, and D6.

Embodiment 3

In embodiment 3, the aberration corrector 116 capable of correcting a high order aberration using the transfer optics including the multipole will be described.

Figure 9A:
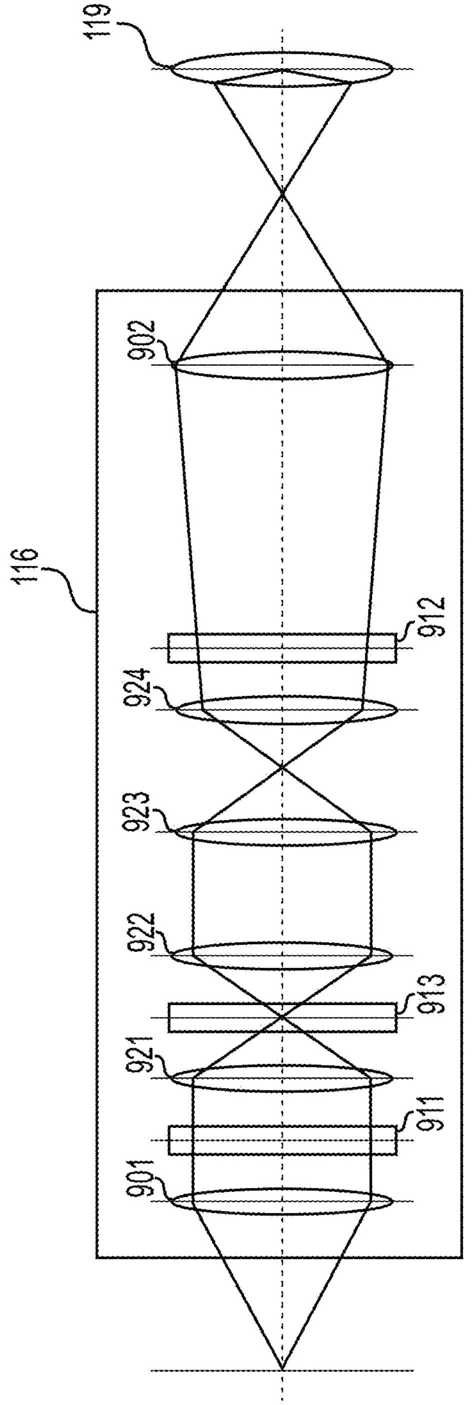
FIG. 9A is a diagram illustrating an example of a configuration of an aberration corrector according to embodiment 3.
Figure 9B:
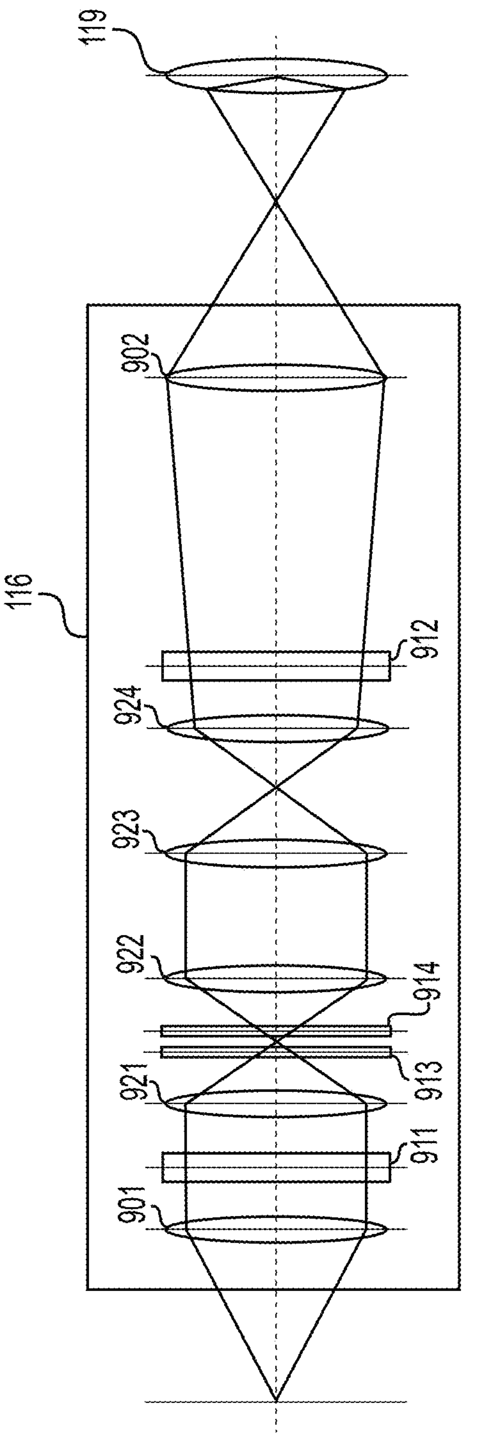
FIG. 9B is a diagram illustrating an example of the configuration of the aberration corrector according to embodiment 3.

FIG. 9A is a diagram illustrating an example of the structure of the aberration corrector 116 according to embodiment 3, and FIG. 9B is a diagram illustrating an example of the structure of the aberration corrector 116 according to embodiment 3.

In the aberration corrector 116 in FIG. 9A, a transfer optics including four round lenses 921, 922, 923, and 924 and a third multipole 913 is disposed between a first multipole 911 and a second multipole 912. The third multipole 913 is disposed at a crossover position between the round lens 921 and the round lens 922. The aberration corrector 116 also includes a first adjustment lens 901 and a second adjustment lens 902, with the round lens 901 placed on the upstream side of 911 and the round lens 902 placed on the downstream side of 912.

The first multipole 911 and the second multipole 912 form a hexapole field. The third multipole 913 forms any pole field of a quadrupole field, a hexapole field, an octupole field, a decapole field, and a dodecapole field. An optical relation between the first multipole 911 and the second multipole 912 is adjusted to be the same as the optical relation between the first multipole 311 and the second multipole 312 according to embodiment 1.

The third multipole 913 and the first multipole 911 are adjusted so as not to establish the imaging relation, and the third multipole 913 and the second multipole 912 are adjusted so as not to establish the imaging relation.

In the aberration corrector 116 in FIG. 9B, a transfer optics including the four round lenses 921, 922, 923, and 924, the third multipole 913, and a fourth multipole 914 is disposed between the first multipole 911 and the second multipole 912. The third multipole 913 and the fourth multipole 914 are disposed in any area centered on the crossover position between the round lens 921 and the round lens 922.

The first multipole 911 and the second multipole 912 form the hexapole field. The third multipole 913 and the fourth multipole 914 forms any pole field of the quadrupole field, the hexapole field, the octupole field, the decapole field, and the dodecapole field. The optical relation between the first multipole 911 and the second multipole 912 is adjusted to be the same as the optical relation between the first multipole 311 and the second multipole 312 according to embodiment 1.

The third multipole 913 and the first multipole 911 are adjusted so as not to establish the imaging relation, and the third multipole 913 and the second multipole 912 are adjusted so as not to establish the imaging relation. Further, the fourth multipole 914 and the first multipole 911 are adjusted so as not to establish the imaging relation, and the fourth multipole 914 and the second multipole 912 are adjusted so as not to establish the imaging relation.

Further, a third multipole 913 and a fourth multipole 914 can control an aberration of the entire optics by controlling a type, a magnitude, and a phase of the multipole field to be formed. A change in the aberration occurring at this time is particularly large in an astigmatism component, and an action thereof also changes depending on a positional relation between the multipole and the crossover in the transfer optics.

In the examples illustrated in FIG. 9A and FIG. 9B, there are two crossovers in the transfer optics, but the same effect can be obtained even if the third multipole 913 and the fourth multipole 914 are disposed in a vicinity of either of the crossover.

In embodiment 3, when the control of the three-lobe aberration described in embodiment 1 is performed, the three-lobe aberration of the entire optics can be controlled by adjusting the focal lengths of the round lens 921 and the round lens 922 or the focal lengths of the round lens 923 and the round lens 924 such that an absolute value of a slope of the charged particle beam passing through the first multipole 911 is different from an absolute value of a slope of the charged particle beam passing through the second multipole 912.

When the focal lengths of the round lens 921 and the round lens 922 are adjusted together with the adjustment of the three-lobe aberration, the positions of both of the two crossovers on the optical axis in the transfer optics change. At this time, in a case in which the third multipole 913 and the fourth multipole 914 are disposed in the vicinity of any of the crossovers, since the positional relation between the crossover and the third multipole 913 and the positional relation between the crossover and the fourth multipole 914 change, amounts of the aberration generated by the third multipole 913 and the fourth multipole 914 also change simultaneously. Therefore, other aberrations also change at the same time as the three-lobe aberration.

On the other hand, when the focal lengths of the round lens 923 and the round lens 924 are adjusted together with the above adjustment of the three-lobe aberration, the position of the crossover formed between the round lens 923 and the round lens 924 changes on the optical axis, but the position of the crossover formed between the round lens 921 and the round lens 922 does not change because the crossover is located on an optically upstream side of the round lens 923 and the round lens 924.

Therefore, in a case in which the third multipole 913 and the fourth multipole 914 are disposed in the vicinity of the crossover between the round lens 921 and the round lens 922, a change in the action produced by the third multipole and the fourth multipole caused by the adjustment of the above three-lobe aberration does not occur. Therefore, the adjustment of the three-lobe aberration and the adjustment performed by the third multipole and fourth multipole can be performed independently of each other.

Therefore, it is preferable that the multipole in the transfer optics be disposed optically upstream of the lens used for adjusting the three-lobe aberration in the transfer optics. In a case in which such a condition is obtained, it is possible to use a configuration in which the transfer optics includes a plurality of doublet optics each including a pair of two round lenses, such as the round lens 921 and the round lens 922. Among these configurations, the minimum configuration is a configuration including two doublet optics, as illustrated in FIG. 9A and FIG. 9B, and the configuration is the simplest, and thus can be said to be one preferable example. At this time, the magnification when the transfer optics forms an image of the center plane of the first multipole is positive.

The aberration corrector 116 according to embodiment 3 mainly corrects the astigmatism by adjusting the third multipole 913, and corrects the three-lobe aberration by adjusting the round lenses 923 and 924.

The invention is not limited to the above embodiments, and includes various modifications. For example, the above embodiments are described in detail for easy understanding of the invention, and the invention is not necessarily limited to those including all the configurations described above. A part of the configuration of each of the embodiments may be added, deleted, and replaced with another configuration. Further, it should be noted that some of the above equations may be expressed in different forms depending on the approximation method, the difference in the order of expansion, and the like. Further, the above description does not take into consideration the influence of the aberration occurring with respect to the aberration component, that is, the so-called combination aberration, but the influence is smaller than the above-described effect, and does not affect the basic action of the invention.

The invention claimed is:

1. An aberration corrector, comprising:

a first multipole and a second multipole configured to form a hexapole field; and a transfer optics including a plurality of round lenses, wherein the transfer optics is disposed between the first multipole and the second multipole, the first multipole and the second multipole have a relationship such that a three-fold symmetric astigmatism is cancelled in the same direction or is strengthened in the same direction by their combined action, the transfer optics provides a first action to a charged particle beam passing through the first multipole, the first action acts on a charged particle beam such that an absolute value of a slope of the charged particle beam passing through the first multipole is different from an absolute value of a slope of the charged particle beam passing through the second multipole, and the first action is performed by the function of the round lenses included in the transfer optics and is performed by adjusting at least one of focal lengths and positions of the plurality of round lenses.

2. The aberration corrector according to claim 1, wherein the first action provided by the transfer optics acts on the charged particle beam such that a center plane of the first multipole is imaged at a magnification absolute value other than 1.

3. The aberration corrector according to claim 1, wherein the first action provided by the transfer optics acts on the charged particle beam such that a center plane of the first multipole is imaged with a positive magnification.

4. The aberration corrector according to claim 1, wherein the plurality of round lenses include round lenses having different focal lengths.

5. The aberration corrector according to claim 1, wherein at least one of an absolute value of a value obtained by dividing the slope of the charged particle beam with respect to a center axis of the first multipole by a distance from the center axis of the first multipole when the charged particle beam passes through the first multipole and an absolute value of a value obtained by dividing the slope of the charged particle beam with respect to a center axis of the second multipole by a distance from the center axis of the second multipole when the charged particle beam passes through the second multipole is 100 or less.

6. The aberration corrector according to claim 1, wherein a magnitude of the hexapole field formed by each of the first multipole and the second multipole is different.

7. The aberration corrector according to claim 1, wherein the transfer optics is optically asymmetric with respect to a plane at an equal distance from the first multipole and the second multipole.

8. The aberration corrector according to claim 1, wherein the transfer optics includes at least one multipole.

9. The aberration corrector according to claim 8, wherein the at least one multipole in the transfer optics is not in an imaging relation with each of the first multipole and the second multipole.

10. The aberration corrector according to claim 8, wherein the at least one multipole in the transfer optics is disposed at a crossover position where the charged particle beam converges or in a predetermined area around the crossover.

11. The aberration corrector according to claim 8, wherein the at least one multipole in the transfer optics forms at least one of a hexapole field, an octupole field, a decapole field, and a dodecapole field by using one of an electric field or a magnetic field.

12. The aberration corrector according to claim 8, wherein an aberration controlled by adjusting any of a focal length and a position of the plurality of round lenses is different from an aberration controlled by adjusting any of a magnitude and a direction of a multipole field formed by the at least one multipole in the transfer optics.

13. The aberration corrector according to claim 12, wherein the aberration controlled by adjusting any of the focal length and the position of the plurality of round lenses is a three-lobe aberration, and the aberration controlled by adjusting any of the magnitude and the direction of the multipole field formed by the at least one multipole in the transfer optics is astigmatism.

14. The aberration corrector according to claim 1, wherein the transfer optics is formed with a plurality of crossovers where the charged particle beam converges, and formation of the crossovers is performed by the function of the round lenses included in the transfer optics.

15. The aberration corrector according to claim 14, wherein the transfer optics includes at least one multipole, and at least one of the plurality of crossovers in the transfer optics is present on a downstream side, with respect to a traveling direction of the charged particle beam, of the at least one multipole included in the transfer optics.

16. The aberration corrector according to claim 1, wherein the transfer optics acts on the charged particle beam such that a center plane of the first multipole with respect to a thickness of the first multipole in an optical axis direction and a center plane of the second multipole with respect to a thickness of the second multipole in the optical axis direction do not satisfy an imaging relation with each other.

17. An electron microscope comprising the aberration corrector according to claim 1.

18. The aberration corrector according to claim 8, wherein the at least one multipole in the transfer optics forms a quadrupole field by using only one of an electric field or a magnetic field.

* * * * *